United States Patent [19]
Hickin et al.

[11] 3,976,991
[45] Aug. 24, 1976

[54] BRIGHTNESS CONTROL AND COMPENSATION CIRCUITRY FOR CATHODE RAY TUBE DISPLAYS

[76] Inventors: Charles Wyndham Robinson Hickin, 812 Country Club Road, Binghamton, N.Y. 13903; David Allen Smith, 2936 Northwood Drive, Endwell, N.Y. 13760

[22] Filed: Sept. 20, 1974

[21] Appl. No.: 507,595

[52] U.S. Cl. .............................. 340/324 A; 235/198
[51] Int. Cl.² ............................................. G06F 3/14
[58] Field of Search ................. 340/324 A, 324 AD; 235/198

[56] References Cited
UNITED STATES PATENTS

| 3,394,367 | 7/1968 | Dye ................................ 340/324 A |
| 3,466,645 | 9/1969 | Granberg et al. ................ 340/324 A |
| 3,510,865 | 5/1970 | Callahan et al. ................ 340/324 A |

*Primary Examiner*—Marshall M. Curtis

[57] ABSTRACT

A cathode ray tube caligraphic display system is described which automatically varies the beam intensity as a function of the writing or "stroke" rates to provide automatic brightness compensation as the symbol or vector write rates vary. The X and Y write rate signals are provided in digital form and converted to ramp voltages of varying slopes to "stroke" the line segments for the desired symbols, vectors or other indicia. The digital X and Y write rate signals are also applied to a Read Only Memory (ROM) which has brightness compensation data stored therein for various combinations of X and Y write rates. The digital signals representing the X and Y write rates function as addresses to the Read Only Memory to read out brightness compensation control signals to control the brightness of the symbol or other displayed object as a function of the write rates. For example, if the write rate increases, which would normally decrease the brightness of the symbol displayed on the cathode ray tube, the video signal applied to the cathode ray tube gun is increased to increase the beam intensity and maintain the brightness constant even though the write rate has increased. Similarly, a decrease in the write rate which would normally cause the intensity or brightness of the symbol, or object, to increase results in a video signal which reduces the brightness to maintain the overall brightness constant. In addition to controlling the brightness as a function of the write rates, provisions are made for modifying or controlling brightness as a function of the symbol size by simultaneously varying the write rates to adjust the symbol size and the beam intensity to maintain constant brightness even though the symbol size may be deliberately changed. In addition, yet another modification of the brightness control and compensation circuit contemplates suitable control of the cathode ray display when the brightness of any symbol or display is programmed to be different from that of the remaining symbol or displays.

9 Claims, 4 Drawing Figures

BRIGHTNESS CONTROL AND COMPENSATION CIRCUITRY FOR CATHODE RAY TUBE DISPLAYS

The instant invention relates to a cathode ray tube display system, and more particularly, to a cathode ray display system in which the brightness of the display is maintained constant even though the writing or deflection rates for the displays are varied.

In cathode ray calligraphic display sytems such as map overlay systems, etc. it is desirable to maintain the deflection rates of the beam constant in order to stroke all the symbols, indicia, etc. at a constant write rate. This avoids variations in the displayed brightness of the symbols, etc. That is, the various symbols, objects or indicia such as vectors, for example, are generated by causing the cathode ray beam to generate line segments of varying slopes and lengths to be portrayed on the cathode ray tube. The write control voltages are supplied to the CRT deflection circuits to control the generation of these line segments. The rates at which the beams are deflected in turn, controls the brightness of the display. The greater the deflection rate of the electron beam, the shorter the time beam resides at any point on the phosphor. The energy transfer to the phosphor and hence the brightness is correspondingly lower. Conversely, the slower the beam deflection, the greater the energy transfer to the phosphor so that the symbols or indicia displayed on the face of the cathode ray tube are brighter. These problems of brightness variations would, as pointed out above, obviously be solved if the deflection rate and hence the writing rate at which any line segment of any symbol or indication is maintained constant. However, as a practical matter, and in practical display systems, it is often not possible to obtain or maintain constant deflection or writing rates for the electron beam and as a result, there are brightness variations in the display as the beam deflection or "write" rates change. It is therefore necessary in systems of this type to vary the brightness controls of the cathode ray tube to compensate for the variations in the deflection or write rates.

One approach which has been utilized in the past to compensate for variations in the deflection or write rate of the electron beam, contemplated an arrangement in which the symbols to be displayed are stored in a symbol memory in the form of X and Y write rate data for each line segment of the symbol. Brightness compensation information was stored in the symbol memory along with the particular combination of X and Y write rates. Thus, when a particular symbol was recovered from the memory and transformed to suitable deflection voltages to stroke the line segments, beam intensity information was simultaneously read out of the memory and applied to the CRT video control circuits to vary the intensity of the beam in order to maintain the overall brightness of the display constant with the varying write rates. This system is adequate and works effectively in many arrangements where all of the symbols or indicia are pre-programmed and may be stored in a memory and called for in response to certain situations and inputs which recover the symbol from the memory. However, certain other indicia such as vectors, for example, are not symbols which may be pre-programmed since a vector is a calculated value determined by the difference between two data points. Thus, when the information from a radar set, for example, is utilized to track an object, a series of data points representing location in the X and Y direction are received and calculated and information as to deflection or write rates for the CRT displays are then transmitted to the CRT for generating and displaying a vector. In an arrangement of this sort, which is not pre-programmed, there is no way to compensate the brightness by storing beam intensity compensation information in a symbol memory. Hence, this prior art arrangement is not adequate for display systems in which indicia such as vectors must be displayed since there is no suitable way of storing data which can be used to compensate for the varying write rates.

It is therefore a principal objective of this invention to provide a display system having continuous brightness compensation of the display as a function of the actual deflection write rates of the displayed object or symbol.

Another objective of the invention is to provide a cathode ray display system in which the brightness is maintained constant for varying deflection/write rates for non-preprogrammed display objects such as vectors or the like.

Yet another objective of the invention is to provide a cathode ray tube display which maintains constant brightness with varying deflection/write rates by compensating the beam intensity directly as a function of the actual deflection/write rates.

Other objectives and advantages of the invention will become apparent as the description thereof proceeds.

The various objectives and advantages of the instant invention are realized in a cathode ray tube display system in which the electrical signals representing the deflection/write rates for the given symbols, objects or indicia to be displayed are supplied in a digital coded form. The digitally coded electrical signals representing the horizontal and vertical write rates, i.e., X and Y deflection signals, are converted in suitable digital to analog converters to an analog voltage. This analog voltage is integrated in integrating amplifiers to provide ramp voltage having the proper slope to stroke the line segments of the symbols etc. The digital signals representing the deflection or writing rates, are also applied to a Read Only Memory (ROM) which has brightness compensating signals for various combinations of vertical and horizontal deflection/write rates stored therein. The digital signals representing the particular write rates act as an address for the Read Only Memory and produce a digital output from the memory which is unique to the particular combination of input signals and hence, represent a brightness compensating signal for that particular combination of X and Y deflection/write rates. The digital output from the Read Only Memory is converted in a digital to analog converter to an analog video signal which is applied to the cathode ray tube gun simultaneously with the application of the deflection voltage to vary the intensity of the electron beam and thus maintain the brightness of the displayed symbols, object or indicia constant with varying deflection/write rates. In addition, modification of the invention is provided to allow change in the symbol or character size and brightness. The write rates are automatically adjusted to compensate for ordered symbols size change while at the same time, the beam intensity is controlled as symbol size is changed. That is, if the symbol size is to be adjusted, meaning that the write rates have to be modified to accommodate the symbol size change, the beam intensity is simultaneously adjusted to compensate for brightness changes due to the changes in the write rates.

The novel features which are characteristic of this invention are set forth with particularity in the appended claims. The invention itself, however, both as to its organization and method of operation, together with other objectives and advantages, may best be understood by reference to the following description taken in connection with the accompanying drawings in which:

Figure 1:
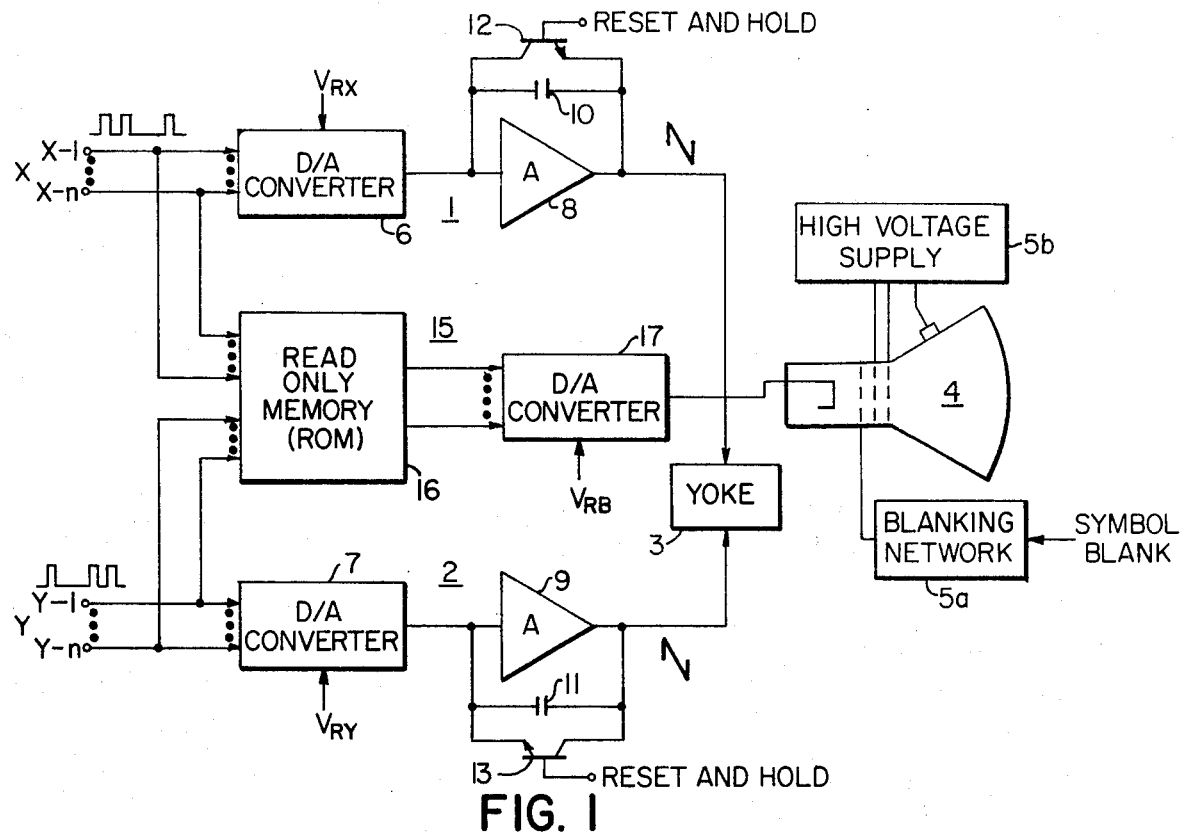
FIG. 1 shows, in block diagram form, the CRT brightness compensation circuitry of the instant invention.

FIG. 1 illustrates in block diagram form a CRT display system in which beam intensity compensation is automatically provided in response to the actual deflection/write rates for the display system to maintain constant brightness. Electrical signals in the form of a plurality of parallel, digital coded signals representing the desired X and Y write rates from a symbol generator, vector computation circuit, etc. are impressed on a plurality of input terminals $X_1$-$X_n$ of an X deflection voltage generating path 1. The digitally coded signals are converted to a suitable X deflection voltage which is applied to the CRT deflection circuitry shown in this embodiment as deflection yokes 3. Similarly, parallel, digital coded information is applied over a plurality of input lines $Y_1$-$Y_n$ to a Y deflection voltage generating path to produce a Y ramp or deflection voltage for the Y yoke of CRT 4. A suitable high voltage supply source 5b is coupled to the anode and focusing electrodes of CRT 5 to establish and control the size of the electron beam. A blanking network 5a is coupled to the control electrode to blank the beam during beam repositioning in response to a blanking signal. That is, when a new symbol is to be displayed the beam must often be repositioned first. During repositioning the beam is blanked to avoid visible streaking. In the embodiment of FIG. 1 the CRT deflection circuits as shown, in block diagram form, as deflection yokes. It will be appreciated, however, that the invention is equally applicable to a CRT having an electrostatic deflection system.

The parallel, digital signals representing the X and Y deflection/write rates are applied in each of the respective X and Y paths to digital to analog (D/A) converters 6 and 7 which may be of the conventional ladder and switch type in which are a plurality of switches and binary weighted resistance ladders. Reference voltages $V_{RX}$ and $V_{RY}$ are impressed on the converters which convert the digital information to an analog output current which is proportional to the input deflection/write rate as defined by the digital input signals. The output current of D/A converters 6 and 7 is proportional to the input deflection/write rate, the internal resistance of the ladder network in the digital to analog converter and the reference voltages. The output currents from converter 6 and 7 are therefore defined by the equations:

$$I_x = \frac{V_{RX}}{R_I} \cdot K_{WX} \qquad (1)$$

in case of D/A converter 6

$$I_y = \frac{V_{RY}}{R_I} \cdot K_{WY} \qquad (2)$$

in case of D/A converter 7:

$R_I$ = the internal resistance of the converters
$K_{WX}$ = the X write rate
$K_{WY}$ = the Y write rate.

$I_X$ and $I_Y$ are applied to the inverting inputs of integrating amplifiers 8 and 9 which generate a ramp or sawtooth voltage whose slope is proportional to the input deflection/write rates $K_{WX}$ and $K_{WY}$. That is, by virtue of the integrating action of the amplifiers the output voltages from amplifiers 8 and 9 are respectively:

$$V_{ox} = \frac{V_{RX} t}{\tau} \cdot K_{WX} \qquad (3)$$

in the case of amplifier 8, and $$V_{oy} = \frac{V_{RY}}{\tau} \qquad (4)$$

in the instance of amplifier 9. Thus, the output voltages are proportional respectively to the X and Y deflection/write rates. The slope of these two voltages, i.e., $V_o/t$ are respectively $$\frac{V_{ox}}{t} = \frac{V_{RX} \cdot K_{WX}}{\tau} \qquad (5)$$

$$V_{oy} = \frac{V_{RY} \cdot K_{WY}}{\tau} \qquad (6)$$

where $\tau$ = the R-C time constant of the internal resistance $R_I$ of the digital to analog converters and the integrating capacitors 10 and 11. The output voltages from integrating amplifiers 8 and 9 are applied through suitable deflection amplifiers, not shown, to yokes 3 of the cathode ray tube and are directly proportional to the deflection/write rate input signals to generate the proper line segments required for the symbols, objects or indicia to be displayed. Reset and Hold transistor switches 12 and 13 are connected across integrating capacitors 10 and 11 and are controlled by reset and hold command pulses applied to the base electrodes to drive the transistors into the conducting states to discharge the capacitors and reset the integrating amplifiers at the termination of any particular line segment.

Coupled to the X and Y deflection voltage generating paths is an intensity compensation circuit shown generally at 15 which senses the digitally coded X and Y input deflection/write rate signals and automatically generates intensity control signals that are applied to the cathode ray tube to maintain the brightness of the symbol or displayed object constant with varying write rates. Thus, the parallel, digitally coded deflection/write rate signals applied at input terminals $X_1$-$X_n$ and $Y_1$-$Y_n$ are applied to the input of Read Only Memory (ROM) 16 which is coded such that the parallel, digital output from ROM 16 represents the required intensity compensation for any given combination of X and Y deflection/write rates. Read Only Memories are well-known digital devices and usually contain input address and chip enable gates, an address decoder matrix, a memory storage area and output drive circuits. Gate selection is achieved with an input address code and the output is parallel, digitally coded pulse train. The parallel input digital signals act as the address for the ROM which is decoded within the memory to activate selective circuits in the memory storage area to produce a parallel digital output which is unique to the particular combination of X and Y deflection/write rates. This digitally coded output from ROM 16 represents a particular intensity compensation signal for the particular X and Y write rates to vary the beam intensity of the CRT and maintain the brightness constant. Read Only Memories are, as pointed out above, well known digital devices manufactured and sold by any number of manufacturers in the U.S. For a further description of such a Read Only Memory and for identification of a number of manufacturers who produce and vend such memories, reference is hereby made to the article entitled "Semiconductor Memories" pps 22–33 of the Feb. 1, 1970 edition of the publication EDN.

The digitally coded parallel output from ROM 16 is applied along with reference voltage $V_{RB}$ to a digital to analog (D/A) converter 17. The output from the converter 17 is an analog video control voltage which is applied to the gun of cathode ray tube 5 to vary the intensity of the beam as the X and Y write rates change to maintain the output brightness of the symbols, objects or indicia constant. The reference voltage $V_{RB}$ applied to digital to analog converter 17 represents a reference brightness and the coded output from ROM 16 produces a video output which varies about the reference output voltage. It can be seen therefore, that the brightness and intensity compensating arrangement of FIG. 1 which maintains the brightness of this very constant with varying deflections/write rates for the display, is characterized by the fact that the intensity compensation signals are read out directly in response to the X and Y write rates and thereby automatically compensate the intensity of the display as these write rates vary.

In some display applications, it is either necessary or desirable that the display provided for symbol size selection. That is, it may often be desirable to vary the size of selected symbols, objects, etc. of the display in order to emphasize or accentuate one relative to others. If such symbol size selection is to be exercised, the deflection/write rates for the cathode ray tube must vary accordingly since enlarging the size of symbols requires a faster deflection/write rate whereas reducing the size of the symbol reduces this rate. If the deflection/write rates for the display vary as the symbol size is selectively varied, it is obvious that a corresponding variation of the beam intensity must be provided lest brightness variations result because of size selection.

Figure 2:
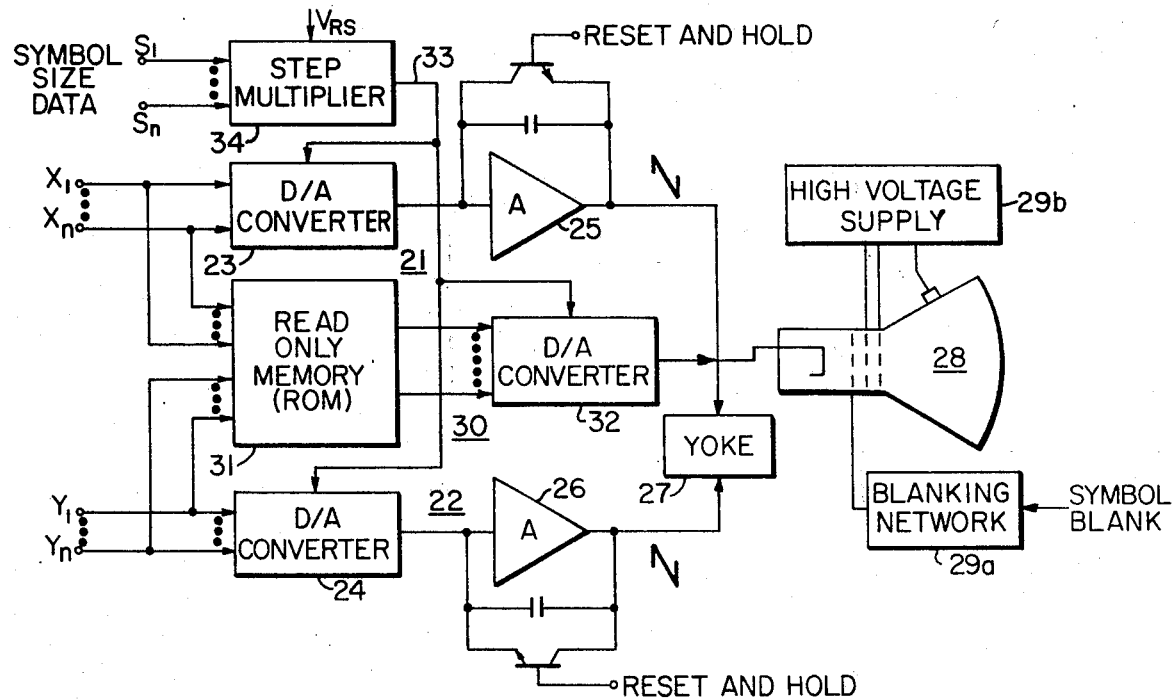
FIG. 2 shows a modification of the brightness compensation circuitry of FIG. 1 to provide symbol size modification simultaneously.

FIG. 2 illustrates an arrangement in which symbol size selection is provided at the digital to analog converter level of the individual XY deflection voltage generating paths. A corresponding modification of the output signals from the Read Only Memory is provided in order to compensate for the variations in the deflection voltage produced by the symbol size selection modification process. The compensation network illustrated in FIG. 2 shows, in a manner similar to FIG. 1, an X voltage deflection generating channel 21 and a Y voltage deflection generating channel 22. Channels 21 and 22 produce, in response to digitally coded input signals, the deflection voltages for stroking the line segments for the symbols, objects and indicia to be displayed. Thus, parallel, coded input signals are applied to X input terminals $X_1$-$X_n$ and to Y input terminals $Y_1$-$Y_n$. These parallel digital coded signals are applied to D/A converters 23 and 24 to produce an analog output voltage which is applied to integrating amplifiers 25 and 26 to produce output ramp voltages having slopes proportional to the X and Y deflection/write rates represented by the digitally coded inputs. These ramps are applied to a yoke 27 which forms part of the cathode ray tube display element 28. The deflection currents produced at the output of the integrating amplifiers when applied to the electromagnetic yokes 27 stroke the line segments to construct the symbols to be displayed. In a manner similar to that described in connection with FIG. 1, a blanking network 29 blanks the beam during repositioning and a high voltage power provides energizing and control voltages for the anode and the grid electrodes of the tube electron gun.

Intensity compensation for cathode ray tube 28 is provided by the compensating path 30 which includes a Read Only Memory (ROM) 31 which receives the parallel coded inputs from $X_1$-$X_n$ and $Y_1$-$Y_n$ as address signals to generate a digital coded output signal which represents an intensity compensation value uniquely associated with particular X and Y write rates. The digitally coded output from ROM 31 is applied to digital to analog converter 32 to produce an analog video output voltage which is applied to the electron gun of the CRT 28 to modify the intensity of the beam and maintain constant brightness with varying deflection/write rates.

Also coupled to the D/A converters in X and Y deflection voltage generating channels 21 and 22 is a symbol size modification circuit shown generally at 33 which selectively varies the size of any symbols, objects and indicia displayed on cathode ray tube 28 by varying the X and Y write rates in response to the symbol size data. Simultaneously, the beam intensity compensation voltage for the CRT is also varied in response to the symbol size data. To this end, selected symbol size data is applied in the form of a parallel digital coded signal to the input terminals $S_1$-$S_n$ of step multiplier 34. Step multiplier 34, in a manner presently to be described, provides a multiplying function in that the output of step multiplier 34 is a signal proportional to the product of the symbol size digital data and a reference voltage $V_{RS}$ applied to the step multiplier. Step multiplier 34 thus varies the reference voltage as a function of the digital input symbol size data. This variable voltage is, in turn, applied as the reference voltage to D/A converters 23 and 24 in the X and Y deflection voltage generating paths. Since the output current from the digital to analog converters in the X and Y paths is proportional to the reference voltage and the input write rate, any variation in the input reference voltage varies the output current from the digital to analog converter. The integrated output current which produces the ramp voltage for the cathode ray tube yoke thus varies in accordance with the symbol size data either to increase or to decrease the write rate as the symbol size is adjusted either upward or downwardly from a reference value. As the write rate is varied in response to the symbol size by varying the reference voltage at the digital to analog converters, it is obvious that additional beam intensity compensation to maintain constant brightness must be provided. Since the variation of the write rates to accommodate selected size data is at the digital converter level, a brightness level error would be introduced absent some additional compensation beyond the Read Only Memory since the information stored therein is responsive only to the input coded X and Y deflection/write rates which are unaffected by the symbol size modifying signals. Consequently, the output from step multiplier 34 is also applied as a reference voltage to the intensity compensating digital to analog converter 32 to vary the analog output signal not only as a function of the input write rates but also as a function of the symbol size selecting signals. Since the output of D/A converter 32 is a function both of the applied reference voltage and the coded digital input, it can be seen that the analog output from that converter is now a function both of the symbol size voltage from network 34 and the intensity compensation digital output voltage from ROM 31. In this fashion, the beam intensity of the cathode ray tube display device is compensated to maintain the brightness constant even though the write rate input signals may vary with various symbols and also if the size of any of the symbols, objects, etc. are selectively varied.

Figure 3:
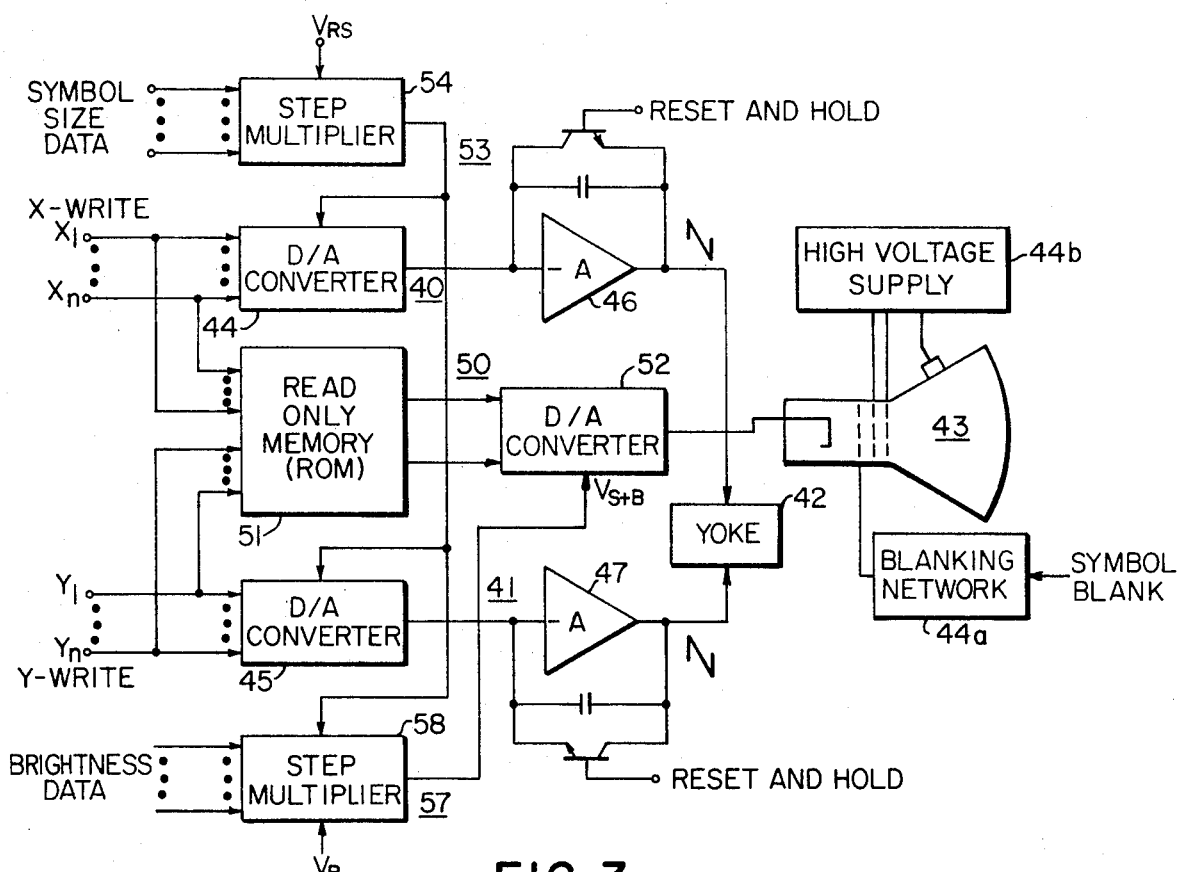
FIG. 3 shows yet another modification of the system in which brightness adjustment for symbols, selected to have different brightness, may be introduced.

In certain other applications, it may be desirable not only to vary the intensity of the CRT beam to control brightness as the write rates vary and as the symbol is selectively varied but also to provide for programmable symbol brightness. That is, in addition to varying the size of selected symbols to make one larger than the other, it may under certain circumstances be desirable purposely to make certain symbols brighter than others in order to provide brightness contrasts between certain symbols. This is achieved in the circuit shown in FIG. 3 by varying the reference voltage to the digital to analog converter in the brightness compensation path through two step multipliers in series. In this fashion, the digital to analog converter output is varied as a function of the symbol size data to compensate for any increase and decrease in symbol size since changes in symbol size have introduced changes in the X and Y write rates, but also to introduce a reference voltage component proportional to any variation from the reference brightness. The display circuit illustrated in FIG. 3 includes, in a manner similar to FIGS. 1 and 2, an X deflection voltage generating channel 40 and a Y deflection voltage generating channel 41. Channels 40 and 41, as described previously, provide the deflection voltages for yoke 42 of a display CRT 43. The channels include digital to analog converter 44 and 45 driving integrating amplifiers 46 and 47. The D/A converters produce an analog output voltage in response to the parallel, digitally coded X and Y write signals impressed on their input terminals with the analog voltages being integrated to produce ramp voltages of varying slope to control the deflection/write rate of the CRT. The slope of the deflection voltages thus generated are a function of the write rate digital signals introduced at the input of the channels. Brightness compensation for variations in the X and Y write rates is provided by compensation network 50 which includes ROM 51 which also receives the parallel, digital X and Y deflection/write rate signals. ROM 51 produces a digital output signal representative of the beam intensity compensation required for the particular X and Y write rates. These digital compensation signals are applied to D/A converter 52 which produces an analog video output signal which controls the intensity of the cathode ray tube beam to maintain the brightness constant. Symbol size modification network 53 is provided which includes a first step multiplier 54 which produces an output analog signal representative of digital symbol size input signal. This analog signal is applied as a reference voltage to digital analog converters 44 and 45 in the X and Y deflection voltage generating channels to vary the write rates as a function of symbol size. The symbol size signal from step multiplier 54 is also coupled to a symbol brightness control network shown generally at 57. Network 57 includes a further step multiplier 58 which has the output from symbol size multiplier 54 applied thereto as a reference voltage. The other input to step multiplier 58 is a parallel, digital coded signal representing brightness data, i.e., the desired change of the symbol brightness from a brightness reference level. The output of step multiplier 58 is therefore the product of the symbol size and desired symbol brightness, i.e., the input reference voltage from multiplier 54 and of the brightness level data. The output of step multplier 58 is applied as a reference voltage to D/A converter 52 in the brightness compensation circuit. The other input to D/A converter 52 is a digitally coded signal representing an intensity compensating signal in response to the X and Y write rates. Consequently, the output from converter 52 is an analog video signal which is the product of write rate, symbol size and the selected symbol brightness.

Figure 4:
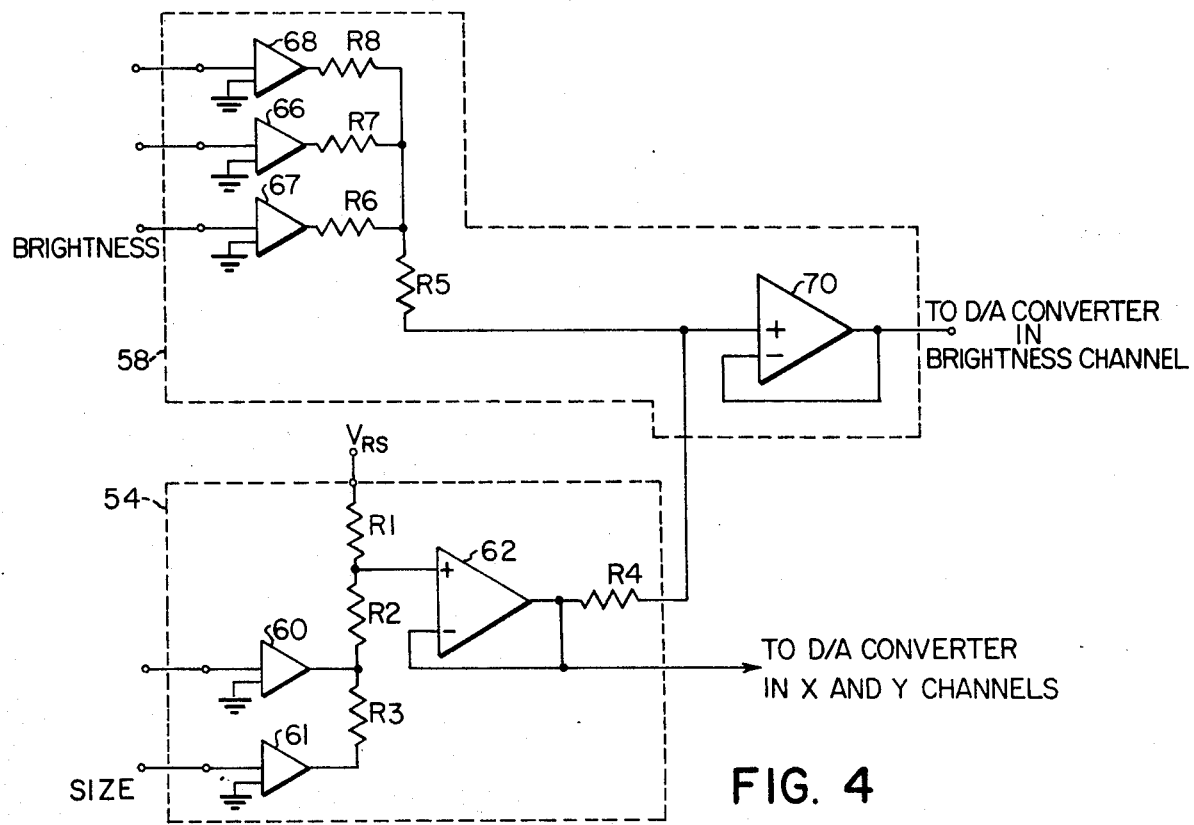
FIG. 4 shows details of a portion of the circuit of FIG. 3.

One form of the cascaded step multipliers which provide the reference voltage for the D/A converter in the brightness control channel to vary the video voltage as a function both of the symbol size and the selected symbol brightness is shown in FIG. 4. The symbol size step multiplier 54 of FIG. 4 includes a plurality of switching amplifiers 60 and 61 coupled between the symbol size input terminals and resistors R1 and R2 and R3 connected in series between the reference voltage terminal $V_{RS}$ and amplifier 61. Switching amplifier 60 is connected to the junction of R2 and R3 and the non-inverting terminal of an operational amplifier 62 is connected to the junction of R1 and R2. Switching amplifiers 60 and 61 are controlled by the digital symbol size input voltages to selectively ground the junctions of resistors R2 and R3 and thereby vary voltage which is applied to the non-inverting terminal of operational amplifier 62. Thus, when the input to either amplifier is a high or logic "one" level the amplifier grounds the ends of resistor to which it is connected. Alternatively, if the input to amplifiers 60 or 61 is at the low or logic "zero" level, the output of the amplifier is such that the junction of the resistors to which the amplifier is connected is open circuited and the amplifiers are effectively disconnected from resistors R1 and R2 and the reference voltage $V_{RS}$. The following Truth Table shows the relationship between the digital inputs to amplifiers 60 and 61 and the input voltage to operational amplifier 62 and illustrates the manner in which the output of operational amplifier 62 is the product of the reference voltage $V_{RS}$ and the digital symbol size input.

|  | Input to Amplifier 60 | Input to Amplifier 61 | $V_o$ | Multiplying Factor for $V_{RS}$ |
|---|---|---|---|---|
| (a) | 0 | 0 | $V_{RS}$ | 1 |

-continued

| | Input to Amplifier 60 | Input to Amplifier 61 | $V_o$ | Multiplying Factor for $V_{RS}$ |
|---|---|---|---|---|
| (b) | 1 | 0 | $V_{RS} \cdot \dfrac{R_2}{R_1+R_2}$ | $\dfrac{R_2}{R_1+R_2}$ |
| (c) | 0 | 1 | $V_{RS} \cdot \dfrac{R_2+R_3}{R_1+R_2+R_3}$ | $\dfrac{R_2+R_3}{R_1+R_2+R_3}$ |
| (d) | 1 | 1 | $V_{RS} \cdot \dfrac{R_2}{R_1+R_2}$ | $\dfrac{R_2}{R_1+R_2}$ |

It can be seen that with the input to both amplifiers at the logic "zero" level resistors R2 and R3 are effectively disconnected from R1 and the full reference voltage $V_{RS}$ is applied to the input of amplifier 62. When the input to amplifier 60 is at the logic "one" level, and the input to amplifier 61 at the logic "zero" level, the junction of resistors R2 and R3 is at ground potential. The voltage applied to the input terminal of amplifier 62 is thus reduced by a factor $R_1/R_1+R_2$. Thus, the output of the operational amplifier is the reference voltage multiplied by the ratio of the resistances for any combination of digital inputs.

This output voltage from multiplier 54 is applied to the D/A converters in the X and Y channels to adjust the write rate of these channels as a function of symbol size. This voltage is coupled via R4 as a reference voltage for symbol brightness multiplier 58. Symbol brightness multiplier 58 includes a plurality of switching amplifiers 65, 66 and 67 which are connected through resistors R6, R7 and R8 to one end of resistor R5. Amplifiers 65-67 act as switching devices which selectively ground one end of resistors R6-R8 and connect them in series with R5 and the non-inverting terminal of operational amplifier 70. The digital brightness data applied to the inputs of amplifiers 65-67 selectively switch these amplifiers into conduction thereby grounding one end of its associated resistor. For example, if amplifier 65 is switched so that it connects R8 to ground while amplifier 66 and 67 are in the open condition, the voltage at the input terminal of operational amplifier 70 is proportional to the product of the reference voltage from multiplier 54 and the quotient of the sum of resistors R8 and R5 over the sum of resistors R4, R5 and R8, i.e., $R_5+R_8/R_4+R_5+R_8$. The following Truth Table establishes the relationship between the digital inputs, the conditions of the switching amplifiers, the multiplying factor, and the magnitude of the voltage applied to the input terminal of operational amplifier 70.

| Input to Amplifier 65 | Input to Amplifier 66 | Input to Amplifier 67 | $V_o$ | |
|---|---|---|---|---|
| 0 | 0 | 0 | | $V_{R54}$ |
| 0 | 0 | 1 | $V_{R54} \cdot$ | $\dfrac{R_5+R_6}{R_4+R_5+R_6}$ |
| 0 | 1 | 0 | $V_{R54}$ | $\dfrac{R_5+R_7}{R_4+R_5+R_7}$ |
| 1 | 0 | 0 | $V_R$ | $\dfrac{R_5+R_8}{R_4+R_5+R_8}$ |

It will be appreciated that inasmuch as the input reference voltage $V_{R54}$ to multiplier 58 is a function of the symbol size (from multiplier 54), the output voltage $V_o$ is the product of the symbol size and the digital brightness level signal applied to multiplier 58.

The output from amplifier 70 forming part of multiplier 58 is an analog voltage which is the product of the symbol size and the symbol brightness input signal and this voltage is applied as a reference to digital to analog converter 52 in the brightness channel to compensate the cathode ray tube beam intensity as the function of symbol size and symbol brightness. Since the other input to this digital to analog converter is a digital signal representing intensity compensation as a function of beam writing rate, the output from the D/A converter is an intensity compensating signal which is a product of symbol write rate, symbol size and selected symbol brightness.

It can be seen from the foregoing that a brightness compensating and control circuit for a display system has been described in which the compensation of the cathode ray tube beam intensity is varied as a function of the write rate as well as of symbol size to maintain constant brightness even as the write rate symbol size.

While a particular embodiment of this invention has been shown and described above, it will, of course, be understood that the invention is not limited thereto since many modifications thereof may be made. It is contemplated by the appended claims to cover any such modifications which fall within the true spirit and scope of this invention.

What is claimed as new and desired to be secured by Letters Patent of the United States is:

1. In a Beam Intensity Compensating System for a cathode ray tube display system, the combination comprising,
   a. means responsive to digital coded signals representative of the X and Y coordinates of selected beam write rates to produce analog beam deflection signals to generate symbol or vector displays,
   b. means to vary the intensity of the beam as a function of the write rates including,
   c. memory storage means having digital data stored therein representing intensity compensation data for varying combinations of X and Y beam write rates said memory storage means being responsive to said digital X and Y write rate signals
   d. means to apply digital X and Y write rate signals as an address to said memory to read out digital intensity compensating data from said memory in response to the particular combination of X and Y write rates,
   e. means coupled to the output of said memory storage means to convert the digital intensity data to an analog intensity control signal,
   f. means to couple the intensity compensating signal to the beam generating means in a cathode ray tube to vary the intensity of the beam as the beam deflection varies to maintain the brightness of the generated display constant with varying beam write rates.

2. The Beam Intensity Compensating System according to claim 1 wherein said means for producing deflection signals from the digital coded X and Y coordinate rate rates includes:
  a. an X channel including a digital to analog converter for producing an analog signal in response to X coordinate digital write rate signal and means to convert said analog signal to a deflection signal having a slope proportional to the X write rate,
  b. a Y channel including a digital to analog converter for producing an analog signal in response to a Y coordinate digital write rate and means to convert said analog signal to a deflection signal having a slope proportional to the Y write rate.

3. The Beam Intensity Compensating System according to claim 2 wherein the memory storage means comprises a Read Only Memory (ROM) and a digital to analog converter coupled to said ROM to convert the digital intensity compensating data to an analog signal, 4. The Beam Intensity Compensating System according to claim 2 in which said means to convert the analog signals from said digital to analog converters includes integrating amplifiers for producing deflection ramp signals having slopes proportional to X and Y write rates.

5. The Beam Intensity Compensating System according to claim 1 including means for producing an analog signal in response to a digital coded signal representing display size information to vary the X and Y coordinate write rates as a function of the display size, and means to vary the beam intensity control signal to vary the intensity as a function both of the initial X and Y coordinate write rate data and the size information.

6. The Beam Intensity Control System according to claim 2 including means responsive to a digital coded signal representing display size for producing an analog signal in response to the display size signal and means to couple said analog signal as a reference voltage to the digital and analog converters in said X and Y paths so that the outputs of said converters is proportional both to the initial X and Y coordinate write rate data and the size information, and means to vary the beam intensity control signal as a function of the display size analog voltage to vary the intensity as a function both of the X and Y write data and the size information.

7. The Beam Intensity Compensating System according to claim 6 wherein the means responsive to digitally coded display information comprises a step multiplier.

8. The Beam Intensity Compensating Circuit, according to claim 5 including means for producing an analog signal in response to a digital coded signal representing display brightness modification information, means coupling the analog signal from said display size means to said brightness analog signal means to modify the output thereof as a function both of display size and brightness modification information, whereby the beam intensity control signal is varied in response to X and Y coordinate write rate data, display size and and display brightness modification information.

9. The Beam Intensity Compensating System according to claim 8 wherein said display size analog signal generating means comprises a first step multiplier, and said brightness modification analog signal generating means is a second step multiplier and means for coupling the analog signal from said first step multiplier as a reference signal for said second step multiplier whereby the analog signal from said second multiplier is proportional both to display size and brightness modification information.

* * * * *